United States Patent [19]
Hong et al.

[11] Patent Number: 5,859,559
[45] Date of Patent: Jan. 12, 1999

[54] MIXER STRUCTURES WITH ENHANCED CONVERSION GAIN AND REDUCED SPURIOUS SIGNALS

[75] Inventors: Bo S. Hong, Norwalk; Lloyd F. Linder, Agsura Hills; Erick M. Hirata, Torrance; Don C. Devendorf, Carlsbad, all of Calif.

[73] Assignee: Raytheon Company, El Segundo, Calif.

[21] Appl. No.: 903,657

[22] Filed: Jul. 31, 1997

[51] Int. Cl.⁶ ........................................... G06G 7/16
[52] U.S. Cl. ........................ 327/359; 327/119; 455/333
[58] Field of Search ................... 327/356–359, 327/119, 120, 121; 455/326, 333

[56] References Cited

U.S. PATENT DOCUMENTS

| | | | |
|---|---|---|---|
| 3,838,262 | 9/1974 | van de Plassche | 327/357 |
| 4,694,204 | 9/1987 | Nishijima et al. | 327/359 |
| 5,532,637 | 7/1996 | Khoury et al. | 327/356 |
| 5,548,840 | 8/1996 | Heck | 327/358 |
| 5,630,228 | 5/1997 | Mittel | 327/359 |

FOREIGN PATENT DOCUMENTS

| | | | |
|---|---|---|---|
| 52-61945 | 5/1977 | Japan | 327/356 |

OTHER PUBLICATIONS

Gray, Paul R., *Analysis and Design of Analog Integrated Circuits*, John Wiley and Sons, New York, pp. 668–679 (1977).

*Primary Examiner*—Kenneth B. Wells
*Attorney, Agent, or Firm*—Leonard A. Alkov; William C. Schubert; Glenn H. Lenzen, Jr.

[57] ABSTRACT

Mixer structures are described which include a current mirror for insertion of trickle currents to an input differential amplifier and an output interface for coupling an output differential amplifier to an output port. The current mirror trickle currents improve the mixer's conversion gain and third-order intercept point and the current mirror introduces them without introducing spurious signals. The output interface couples mixer currents to the output port while isolating the output port from power-supply spurious signals.

19 Claims, 2 Drawing Sheets

MIXER STRUCTURES WITH ENHANCED CONVERSION GAIN AND REDUCED SPURIOUS SIGNALS

BACKGROUND OF THE INVENTION

1. Field of the Invention

The present invention relates generally to mixers and more particularly to integrated-circuit mixers.

2. Description of the Related Art

Basically, a mixer multiplies two signals in a nonlinear process which generates intermodulation products whose frequencies are the sums and differences of integral multiples of the input signal frequencies. For example, if the input signals have angular frequencies of $\omega_1$ and $\omega_2$, the intermodulation products will have frequencies of $n\omega_1 \pm m\omega_2$. In particular, sum and difference signals are generated which have frequencies of $\omega_1+\omega_2$ and $\omega_1-\omega_2$ respectively. Other exemplary intermodulation products are second-order products (harmonics) having frequencies such as $2\omega_1$ and $2\omega_2$ and third-order products having frequencies such as $2\omega_1-\omega_2$ and $2\omega_2-\omega_1$.

In an exemplary mixer use, an intermediate frequency (IF) signal is mixed with a local oscillator (LO) signal to generate (typically with filtering to remove undesired intermodulation products) a radio-frequency (RF) signal (i.e., the IF signal is upconverted by the LO signal to form an RF signal). In this use, the ratio of the RF signal to the IF signal is typically referred to as the mixer's conversion gain.

Conversely, an RF signal can be mixed with an LO signal to generate (again with filtering to remove undesired intermodulation products) an IF signal at a frequency where filtering and/or gain may be easier to implement (i.e., the RF signal is downconverted by the LO signal to form an IF signal). In this use, the ratio of the IF signal to the RF signal is typically referred to as the mixer's conversion gain.

When the fundamental frequencies $\omega_1$ and $\omega_2$ are close to one another, the third-order intermodulation products $2\omega_1-\omega_2$ and $2\omega_2-\omega_1$ lie in the region of the fundamentals and are difficult to filter out. Accordingly, the nonlinear elements of mixers are sometimes placed in balanced arrangements which oppose the third-order intermodulation products of the elements to thereby reduce their amplitude at the mixer output. The third-order intercept point is a mixer figure of merit. Increasing the third-order intercept point of a mixer reduces the amplitude of its third-order intermodulation products.

The nonlinearities of semiconductor diodes and transistors have been extensively employed in mixer structures. Integrated circuit mixers are often realized with transistors which not only produce the necessary nonlinear multiplication process but provide conversion gain as well.

FIG. 1 illustrates an exemplary mixer 20 which has an isolation amplifier 22 inserted between an input differential amplifier 24 and an output differential amplifier 26. The input differential amplifier 24 includes a pair of transistors 27 and 28 whose emitters are respectively coupled to ground through current sources 31 and 32 and are coupled together by a resistor 34. The bases of the transistors 27 and 28 form a first input port 36 and output paths of the input differential amplifier 24 are formed by the collectors 37 and 38.

The output amplifier 26 includes two differential pairs 40 and 42 of transistors 44. The bases of the differential pairs are cross-coupled to form a second input port 50. The collectors of the differential pairs are cross-coupled and connected to a bias port 52 by output resistors 53 and 54. The cross-coupled collectors also form an output port 56.

The emitters of the differential pairs 40 and 42 are connected to the output paths 37 and 38 of the transistors 30 and 32 by the isolation amplifier 22. In particular, the isolation amplifier has isolation transistors 60 and 62 which are respectively coupled in cascode relationships with transistors 27 and 28 of the differential input amplifier 22. That is, the emitters of isolation transistors 60 and 62 are respectively connected to the collectors 37 and 38 of the input transistors 27 and 28. Collectors of the isolation transistors 62 and 64 are respectively connected to the emitters of the differential pairs 40 and 42 and bases of the isolation transistors 62 and 64 are connected to a bias port 66.

The isolation amplifier 22 facilitates the introduction of trickle currents 68 and 69 by current resistors 70 and 71 which are coupled between the collectors 37 and 38 of the input differential amplifier and the bias port 52. The magnitudes of the trickle currents are set by a voltage at the bias port 66 and by the impedance of the current resistors 70 and 71.

The mixer 20 is of a type conventionally referred to as a "Gilbert mixer". In an exemplary operation of the mixer 20, a first signal having an angular frequency of $\omega_1$ is applied at the first input port 36 and a second signal having an angular frequency of $\omega_2$ is applied at the second input port 50. First-signal currents generated by the input differential amplifier 24 are passed through the isolation amplifier 22 to generate differential first-signal currents in the output differential amplifier 26. The second signal also generates differential currents in the output differential amplifier 26 which mix with the first-signal differential currents to produce intermodulation products at the output port 56.

More particularly, the transistors 44 of the output differential amplifier 24 are essentially arranged in a mixing ring. First-signal currents are applied across the cross-coupled emitters of this ring and second-signal currents are applied to the cross-coupled bases of the ring. Currents of the first signal are switched on and off at the rate of the second signal to generate intermodulation products which are coupled to the output port 56 from collectors at opposite sides of the ring.

The balanced arrangement of the mixing ring facilitates a reduction of the second-order intermodulation products. Introduction of the trickle currents 68 and 69 increases the collector currents of the input differential amplifier 24 above the currents 72 and 73 that flow through the isolation amplifier 22. The added current enhances the amplifier's transconductance and, thus, the mixer's conversion gain and its third-order intercept point. Unfortunately, the current resistors 68 and 69 provide paths from the bias port 52 for the introduction of power supply fluctuations that modulate the transconductance of the input differential amplifier 24. This effect can be reduced by increasing the magnitude of current resistors 70 and 71 but this reduces the trickle currents 68 and 69 and the advantages which they provide. In addition, resistors 53 and 54 provide paths which introduce power supply noise into the output port 56.

SUMMARY OF THE INVENTION

The present invention is directed to mixer structures which are especially suited for realization in integrated circuits and which achieve high conversion gains and third-order intercept points while reducing the introduction of spurious signals into the mixer output.

These goals are achieved with mixer structures in which a current mirror introduces trickle currents to enhance the transconductance of an input differential amplifier. The current mirror improves the mixer's conversion gain and third-order intercept point and the current mirror's inherent isolation properties isolate the mixer from power supply fluctuations. Mixer structures of the invention also include an output interface which couples mixing currents of an output differential amplifier to the mixer's output port. The output interface provides an active load which carries the mixing currents of the output differential amplifier. The output interface also provides a current conveyor which conveys currents to the mixer's output port that are representative of the mixing currents in the active load. The structure of the output interface effectively isolates the output port from power supply spurious signals.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
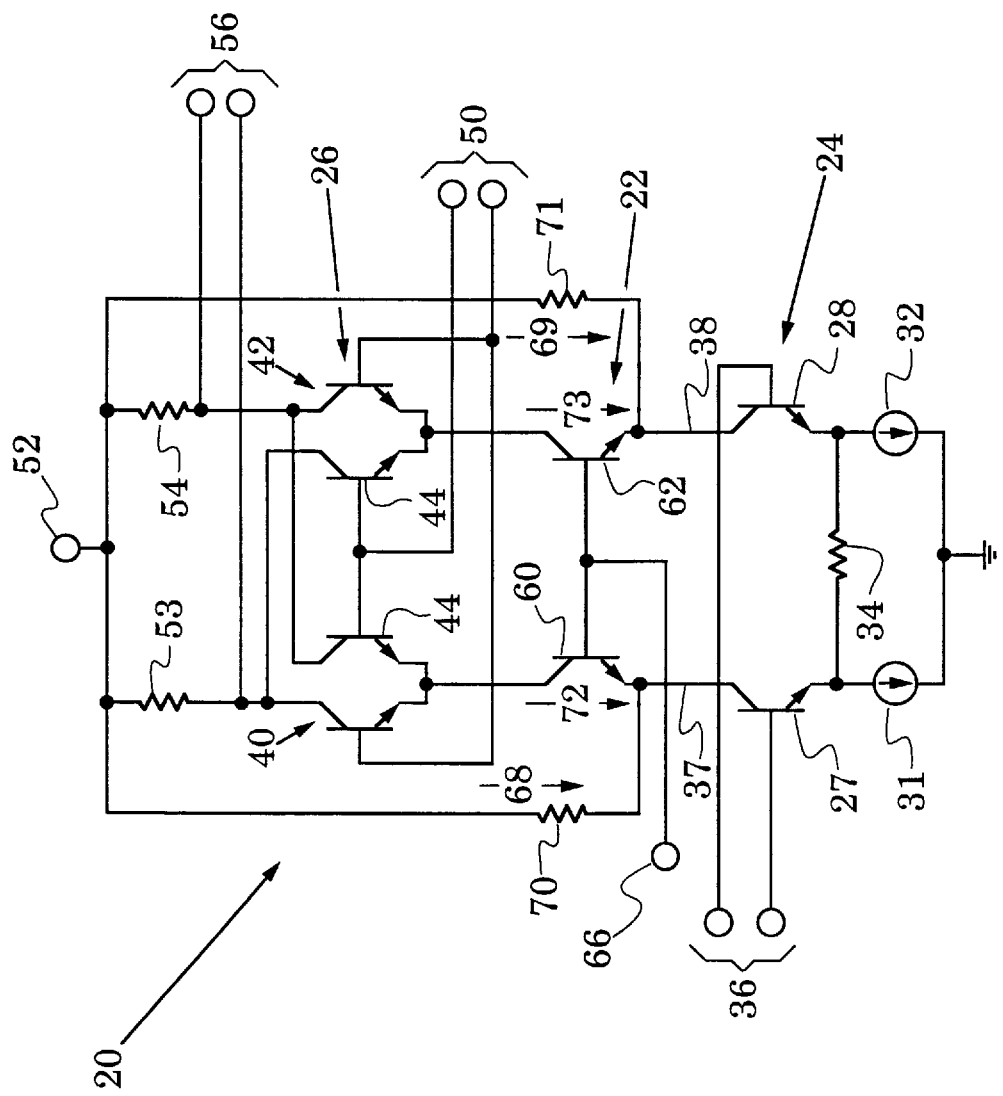
FIG. 1 is a schematic of a conventional integrated-circuit mixer.
Figure 2:
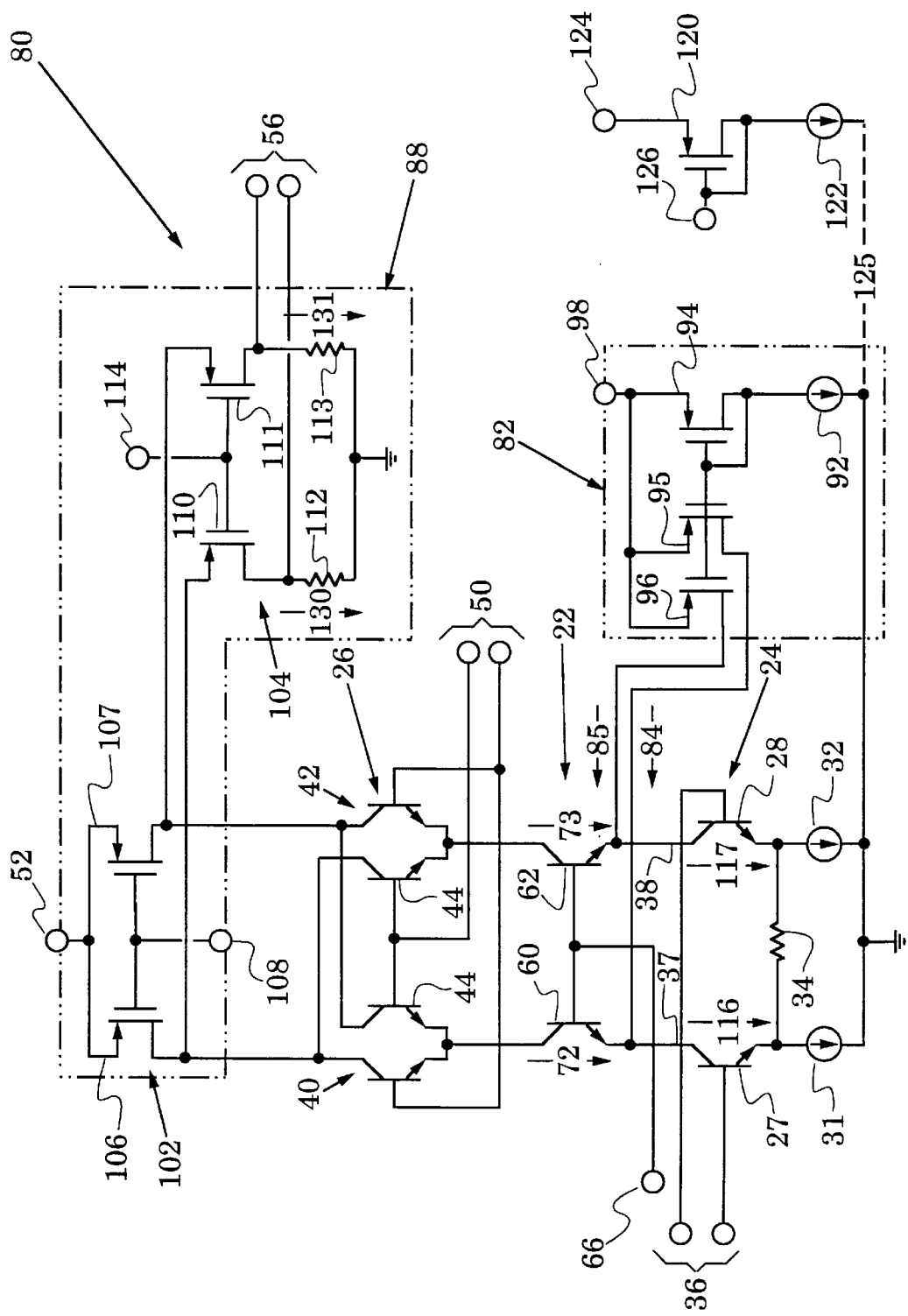
FIG. 2 is a schematic of an integrated-circuit mixer of the present invention.

FIG. 2 illustrates a mixer 80 in accordance with the present invention. FIG. 2 is similar to FIG. 1 with like elements represented by like reference numbers. Similar to the mixer 20 of FIG. 1, the mixer 80 has an isolation amplifier 22 that couples an input differential amplifier 24 to an output differential amplifier 26.

However, the mixer 80 has an active, controlled current source in the form of a current mirror 82 which introduces selectable, controlled trickle currents 84 and 85 to the input differential amplifier 24. The current mirror 82 enhances the mixer's conversion gain and permits independent selection of its operating point without introducing spurious signals. In addition, the mixer 80 has an output interface circuit 88 which couples the mixer 80 to its bias port 52 and its output port 56. The output interface 88 isolates the mixer 80 and its output signal from the degrading effects of power supply noise.

In particular, the current mirror 82 has a current source 92 that is arranged in parallel with current sources 31 and 32 and also has Metal Oxide Semiconductor (MOS) transistors 94, 95 and 96 which have their gates coupled together and their sources coupled together. The coupled sources are connected to a bias port 98 (which is preferably common with the bias port 52) and the drain of MOS transistor 94 is connected to its gate and to the current source 92. The gate-to-source voltages across the MOS transistors are equal and, when realized as an integrated circuit, the transconductances of the transistors are also substantially equal. Thus, the trickle currents 84 and 85 are controlled to be substantially equal to the current of the current source 92.

In detail, the output interface 88 includes an active load 102 and a current conveyor 104. The active load 102 has MOS load transistors 106 and 107 which connect the cross-coupled collectors of the differential pairs 40 and 42 to the bias port 52. The bases of the transistors 106 and 107 are connected to a bias port 108. The current conveyor 104 has MOS output transistors 110 and 111 which are respectively connected in cascode relationships with the load transistors 106 and 107. The drains of the output transistors 110 and 111 are coupled to the output port 56 and are also coupled to ground by load resistors 112 and 113. The bases of the output transistors 110 and 111 are connected to a bias port 114.

In operation of the current mirror 82, the trickle currents 84 and 85 are set by selection of the current magnitude of the current source 92. Thus, the collector current 116 through the input transistor 27 is the sum of the isolation transistor current 72 and the trickle current 84. Similarly, the collector current 117 through the input transistor 28 is the sum of the isolation transistor current 73 and the trickle current 85. Independently, the operating point of the input transistors 27 and 28 is selected by the voltage that is applied to the bias port 66.

The current mirror 82 facilitates independent selection of the quiescent currents and the operating points of the input differential amplifier 24. For example, the quiescent transistor currents can be set with the current mirror 82 to enhance the conversion gain and third-order intercept point of the mixer 80 and the operating point of the input transistors 27 and 28 selected with a voltage at the bias port 66 to optimize the head room of the collectors 37 and 38. In addition, power supply fluctuations (e.g., at the bias port 52) are effectively isolated from the mixer 80 by the isolation properties of the current mirror 82.

In operation of the output interface 88, the load transistors 106 and 107 are biased to generate the isolation transistor currents 72 and 73. The magnitude of these currents is selected so that they add to the trickle currents 84 and 85 and supply the selected collector collector currents 116 and 117 of the input differential amplifier 24.

An exemplary biasing circuit for the load transistors 106 and 107 is formed by adding (as indicated by the broken line 125) another MOS transistor 120 and a current source 122 in series between a bias port 124 and ground. The gate and drain of the transistor 120 are coupled together and form a bias port 126. When the bias ports 52 and 124 are coupled together and the bias ports 108 and 126 are coupled together, the transistors 106, 107 and 120 form a current mirror so that the currents 72 and 73 in the isolation amplifier 22 are substantially equal to the current of the current source 122.

In operation of the current conveyor 104, a bias is placed on the bias port 114 to cause the output transistors 110 and 111 to generate quiescent output currents 130 and 131 in the output resistors 112 and 113. These currents can be selected so that the quiescent voltages across the output resistors 112 and 113 obtain a desired operation point. This operating point can thus be selected to enhance the head room at the output port 56.

In response to mixing currents in the load transistors 106 and 107, the cascode-coupled output transistors 110 and 111 convey currents to the output port which are representative of the mixing currents. At the same time, the output resistors 112 and 113 are referenced to ground and the output port 56 is effectively isolated by the output transistors 110 and 111 from power supply noise that may be present at the bias port 52.

The mixer embodiment 80 has been described with bipolar junction transistors in the isolation amplifier 22, the input differential amplifier 24 and the output differential amplifier 26 and with MOS transistors in the current mirror 82 and the output interface 88. Mixers of the invention are particularly suited for realization in integrated circuits, e.g., in a BiCMOS (Bi Complementary Metal Oxide Semiconductor) fabrication process.

Bipolar junction transistors particularly enhance the linearity of the amplifiers 22, 24 and 26 but other mixer embodiments can be formed with different transistors. Although MOS transistors particularly reduce current errors in the current mirror 82, other mixer embodiments can be formed with different transistors. Finally, the use of MOS transistors in the output interface 88 reduces current imbalances that might produce output spurious signals but other mixer embodiments can be formed with different transistors.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A mixer, comprising:
    an input differential amplifier having a first input port and first and second output paths;
    an output differential amplifier having first and second differential pairs in which inputs of said differential pairs are cross-coupled to form a second input port and outputs of said differential pairs are cross-coupled to form an output port;
    an isolation amplifier coupling said first and second output paths of said input differential amplifier to said output differential amplifier; and
    an active current source generating trickle currents and coupled to supply said trickle currents to said first and second output paths;
    wherein said active current source is a current mirror configured to supply said first and second trickle currents to said first and second output paths and wherein said current mirror includes:
        first, second and third current transitors which each have first and seocnd current terminals that are responsive to a control terminal, wherein the first current terminals of said first, second and third current transistors are coupled together, the control terminals of said first, second and third current transistors and the seocnd current terminal of said first current transistor are coupled together, and the second current terminals of said second and third transistors are coupled respectively to said first and second output paths; and
        a current source coupled to said second current terminal of said first current transistor;
        said trickle currents enhancing the conversion gain of said mixer between said first and second input ports and said output port.

2. The mixer of claim 1, wherein said first, second and third current transistors are field-effect transistors.

3. The mixer of claim 1, wherein said first and second differential pairs include transistors which each have first and second current terminals that are responsive to a control terminal, said first and second differential pairs arranged with their control terminals cross-coupled to form said first input port, their first current terminals coupled to said isolation amplifier and their second current terminals cross-coupled to form said output port.

4. The mixer of claim 1, wherein said input differential amplifier includes first and second input transistors; and
    said isolation amplifier includes first and second isolation transistors which are respectively coupled in cascode relationships with said first and second input transistors.

5. The mixer of claim 1, wherein said input differential amplifier includes first and second input transistors; and
    at least one resistor coupled to degeneratively reduce the gain of said first and second input transistors.

6. A mixer, comprising:
    an input differential amplifier having a first input port and first and second output paths;
    an output differential amplifier having first and second differential pairs in which inputs of said differential pairs are cross-coupled to form a second input port and outputs of said differential pairs are cross-coupled to form an output port;
    an isolation amplifier coupling said first and second output paths of said input differential amplifier to said output differential amplifier;
    an active current source generating trickle currents and coupled to supply said trickle currents to said first and second output paths; and
    an output interface inserted between said output differential amplifier and said output port, said output interface having an active load coupled to said cross-coupled collectors of said output differential amplifier and further having a current conveyor inserted between said active load and said output port and configured to convey currents to said output port which are representative of currents in said active load;
    wherein said active load includes first and second load transistors coupled to said cross-coupled outputs of said differential pairs; and
    said current conveyor includes:
        first and second output transistors coupled to said output port and respectively arranged in cascode relationships with said first and second load transistors; and
        first and second output resistors coupled to said output port;
    said trickle currents enhancing the conversion gain of said mixer between said first and second input ports and said output port.

7. A mixer, comprising:
    an input differential amplifier having a first inupt port and first and second output paths;
    an output differential amplifier having first and second differential pairs of transistors in which common emitters of said differential pairs are coupled to said first and second output paths, inputs of said differential pairs are cross-coupled to form a second input port and outputs of said differential pairs are cross-coupled to form an output port;
    a current source that generates trickle currents and is arranged to introduce said trickle currents into said first and second output paths; and
    an active load that generates mixing currents and is arranged to couple said mixing currents to said cross-coupled outputs of said output differential amplifier.

8. The mixer of claim 7, wherein said active load includes:
    first and second load transistors respectively coupled to different sides of said cross-coupled outputs of said differential pairs; and
    a third transistor coupled to mirror a current into each of said first and second load transistors to thereby form said mixing currents.

9. The mixer of claim 7, further including an isolation amplifier inserted between said first and second output paths and said output differential amplifier.

10. The mixer of claim 9, wherein said input differential amplifier, said output differential amplifier and said isolation amplifier are formed with bipolar junction transistors and wherein said current source and said active load are formed with field-effect transistors.

11. A mixer comprising:

an input differential amplifier having a first input port and first and second output paths;

an output differential amplifier coupled to said first and second output paths, said output differential amplifier having first and second differential pairs in which inputs of said differential pairs are cross-coupled to form a second input port and outputs of said differential pairs are also cross-coupled;

an isolation amplifier that couples said first and second output paths to said output differential amplifier;

an output interface having an active load coupled to said cross-coupled collectors of said output differential amplifier and further having a current conveyor which defines an output port and which is configured to convey currents to said output port which are representative of currents in said active load; and a current source generating trickle currents and coupled to supply said trickle currents to said first and second output paths wherein said current source includes a current mirror configured to supply said first and second trickle currents to said first and second output paths.

12. The mixer of claim 11, wherein said current mirror includes:

first, second and third current transistors which each have first and second current terminals that are responsive to a control terminal, wherein the first current terminals of said first, second and third current transistors are coupled together, the control terminals of said first, second and third current transistors and the second current terminal of said first current transistor are coupled together, and the second current terminals of said second and third transistors are coupled respectively to said first and second output paths; and a current source coupled to said second current terminal of said first current transistor.

13. The mixer of claim 11, wherein said input differential amplifier includes first and second input transistors; and said isolation amplifier includes first and second isolation transistors which are respectively coupled in a cascode relationship with said first and second input transistors.

14. The mixer of claim 11, wherein said first and second differential pairs include transistors which each have first and second current terminals that are responsive to a control terminal, said first and second differential pairs arranged with their control terminals cross-coupled to form said second input port, their first current terminals coupled to said isolation amplifier and their second current terminals cross-coupled to said active load.

15. A mixer, comprising:

an input differential amplifier having a first input port and first and second output paths;

an output differential amplifier having first and second differential pairs of transistors in which inputs of said differential pairs are cross-coupled to form a second input port and outputs of said differential pairs are cross-coupled to form an output port;

an isolation amplifier coupling said first and second output paths of said input differential amplifier to said output differential amplifier;

a current mirror that generates first and second trickle currents and respectively introduces said first and second trickle currents into said first and second output paths; and an active load that generates mixing currents and is arranged to couple said mixing currents to said cross-coupled outputs of said output differential amplifier.

16. The mixer of claim 15, further including cascode-coupled output transistors inserted between said cross-coupled outputs of said output differential amplifier and said output port.

17. The mixer of claim 9, wherein said active load includes:

first and second load transistors respectively coupled to different sides of said cross-coupled outputs of said differential pairs; and a third transistor coupled to mirror a current into each of said first and second transistors to thereby form said mixing currents.

18. The mixer of claim 15, wherein said input differential amplifier, said output differential amplifier and said isolation amplifier are formed with bipolar junction transistors and wherein said current mirror and said active load are formed with field-effect transistors.

19. A mixer, comprising:

an input differential amplifier having a first input port and first and second output paths;

an output differential amplifier having first and second differential pairs in which inputs of said differential pairs are cross-coupled to form a second input port and outputs of said differential pairs are cross-coupled;

an isolation amplifier coupling said first and second output paths of said input differential amplifier to said output differential amplifier;

a current mirror configured to supply first and second trickle currents to said first and second output paths; and an output interface having an active load coupled to said cross-coupled collectors of said output differential amplifier and further having a current conveyor which defines an output port and which is configured to convey currents to said output port which are representative of currents in said active load;

wherein said current mirror includes:

first, second and third current transistors which each have first and second current terminals that are responsive to a control terminal, wherein the first current terminals of said first, second and third current transistors are coupled together, the control terminals of said first, second and third current transistors and the second current terminal of said first current transistor are coupled together, and the second current terminals of said second and third transistors are coupled respectively to said first and second output paths; and a current source coupled to said second current terminal of said first current transistor.

* * * * *